(12) United States Patent
Paolucci et al.

(10) Patent No.: US 7,901,776 B2
(45) Date of Patent: Mar. 8, 2011

(54) PLASMA DEPOSITED MICROPOROUS CARBON MATERIAL

(75) Inventors: Dora M. Paolucci, St. Paul, MN (US); Moses M. David, Woodbury, MN (US); Neal A. Rakow, Woodbury, MN (US); John E. Trend, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/618,010

(22) Filed: Dec. 29, 2006

(65) Prior Publication Data

US 2008/0160858 A1  Jul. 3, 2008

(51) Int. Cl.
  *B32B 9/00* (2006.01)
(52) U.S. Cl. ............. 428/408; 423/447.1
(58) Field of Classification Search ........... 428/408; 977/742; 427/297; 423/447.1
  See application file for complete search history.

(56) References Cited

U.S. PATENT DOCUMENTS

| | | | |
|---|---|---|---|
| 4,685,940 A | 8/1987 | Soffer et al. | |
| 5,972,079 A | 10/1999 | Foley et al. | |
| 6,039,792 A | 3/2000 | Calamur et al. | |
| 6,297,293 B1 * | 10/2001 | Bell et al. | 521/99 |
| 6,331,209 B1 * | 12/2001 | Jang et al. | 117/90 |
| 6,432,866 B1 * | 8/2002 | Tennent et al. | 502/180 |
| 7,030,167 B2 | 4/2006 | Gunther | |
| 7,048,902 B2 | 5/2006 | Gordeev et al. | |
| 7,056,455 B2 | 6/2006 | Matyjaszewski et al. | |
| 7,071,287 B2 * | 7/2006 | Rhine et al. | 528/353 |
| 2003/0185998 A1 | 10/2003 | Hong et al. | |

FOREIGN PATENT DOCUMENTS

| | | |
|---|---|---|
| EP | 0617997 | 10/1994 |
| JP | 9142141 | 6/1997 |
| JP | 2006-335596 | 12/2006 |
| WO | WO 2005/012397 A2 | 2/2005 |

OTHER PUBLICATIONS

Budd et al., "Free Volume and Intrinsic Microporosity in Polymers", Journal of Materials Chemistry, 2005, 15, pp. 1977-1986.

Budd et al, Polymers of Intrinsic Microporosity (PIMs): Robust, Solution-Processable, Organic Nanoporous Materials, Chem. Commun., 2004, pp. 230-231.

McKeown et al., "Polymers of Intrinsic Microporosity (PIMs): Bridging the Void Between Microporous and Polymeric Materials", Chem. Eur. J., 2005, 11, pp. 2610-2620.

(Continued)

*Primary Examiner* — Angela Ortiz
*Assistant Examiner* — Daniel Miller
(74) *Attorney, Agent, or Firm* — Julia A. Lapos-Kuchar; Daniel R. Pastirik; Pamela L. Stewart

(57) ABSTRACT

A microporous carbon material includes a porous carbon skeleton having an average pore size from 0.1 to 10 nanometers and being substantially free of pores greater than 1 micrometer. Methods of forming the microporous carbon material are also disclosed.

22 Claims, 10 Drawing Sheets

OTHER PUBLICATIONS

Wood, "Estimating Services Lives of Organic Vapor Cartridges", Journal of American Industrial Hygiene Association, 1994, 15, 1, pp. 11-15.

Donner, S. et al., "Fabrication of Optically Transparent Carbon Electrodes by the Pyrolysis of Photoresist Films: Approach to Single-Molecule Spectroelectrochemistry," *Analytical Chemistry* vol. 78, No. 8 (2006) p. 2816-2822.

Lee, J., et al., "Analysis of Amorphous Carbon Thin Tilms by Spectroscopic Ellipsometry," *Journal of Non-Crystalline Solids* vol. 227-230 (1998) p. 617-621.

Zumdahl, Steven S., *Chemistry*, Chapter 10, "Carbon and Silicon: Network Atomic Solids," D.C. Health and Company (1993) p. 458-459.

* cited by examiner

PLASMA DEPOSITED MICROPOROUS CARBON MATERIAL

FIELD

The present disclosure relates to a plasma deposited microporous carbon material, methods of forming microporous carbon material, and articles including the same.

BACKGROUND

The development of robust chemical sensors for a range of analytes remains an important endeavor for applications such as environmental monitoring, product quality control, and chemical dosimetry. Among the many methods available for chemical sensing, calorimetric techniques remain advantageous in that the human eye can be used for signal transduction, rather than extensive instrumentation.

Though calorimetric sensors currently exist for a range of analytes, most are based upon employing dyes or colored chemical indicators for detection. Such compounds are typically selective, meaning arrays are necessary to enable detection of various classes of compounds. Moreover, many of these systems have lifetime limitation issues, due to photobleaching or undesirable side reactions. Other optical sensing techniques, such as surface plasmon resonance and spectral interferometry, require substantial signal transduction hardware to provide response, and thus are not useful for simple visual indication.

Methods for the synthesis of so called activated carbon are known. While these methods produce porous carbon networks, the pore size distribution is very wide and uncontrolled.

BRIEF SUMMARY

The present disclosure relates to a plasma deposited microporous carbon material, methods of forming carbon material, and articles including the same.

In a first embodiment, a microporous carbon material includes a porous carbon skeleton having an average pore size from 0.1 to 10 nanometers and being substantially free of pores greater than 1 micrometer.

In another embodiment, a method of forming a microporous carbon material includes forming a hydrocarbon plasma from a hydrocarbon gas, depositing the hydrocarbon plasma on a substrate to form a hydrocarbon layer, and heating the hydrocarbon layer and removing at least a portion of the hydrogen to form a microporous carbon material. In some embodiments, the hydrocarbon layer has greater than 50 atomic % carbon and less than 50 atomic % hydrogen.

BRIEF DESCRIPTION OF THE DRAWINGS

The invention may be more completely understood in consideration of the following detailed description of various embodiments of the invention in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
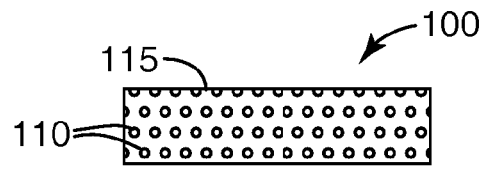
FIG. 1 is a schematic cross-sectional view of an illustrative microporous carbon material.

In the following description, reference is made to the accompanying drawings that form a part hereof, and in which are shown by way of illustration several specific embodiments. It is to be understood that other embodiments are contemplated and may be made without departing from the scope or spirit of the present invention. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural reference, unless the content clearly dictates otherwise. As used in this specification and the appended claims, the term "or" is generally employed in its sense including "and/or" unless the content clearly dictates otherwise.

The term "polymer" will be understood to include polymers, copolymers (e.g., polymers formed using two or more different monomers), oligomers and combinations thereof, as well as polymers, oligomers, or copolymers that can be formed in a miscible blend.

"Porous" when used with respect to a material means that the material contains a connected network of pores (which may, for example, be openings, interstitial spaces or other channels) throughout its volume.

"Size" when used with respect to a pore means the pore diameter for a pore having a circular cross section, or the length of the longest cross-sectional chord that may be constructed across a pore having a non-circular cross-section.

"Microporous" when used with respect to a material means that the material is porous with an average pore size of about 0.3 to 100 nanometers.

"Amorphous" means a substantially randomly ordered non-crystalline material having no x-ray diffraction peaks or modest x-ray diffraction peaks.

"Plasma" means a partially ionized gaseous or fluid state of matter containing reactive species that include electrons, ions, neutral molecules, free radicals, and other excited state atoms and molecules. Visible light and other radiation are typically emitted from the plasma as the species included in the plasma relax from various excited states to lower or ground states.

"Hydrocarbon" refers to an organic consisting of the elements carbon and hydrogen.

This disclosure relates to microporous carbon material having a controlled pore size. In particular, the present disclosure is directed to a microporous carbon material having a porous carbon skeleton with an average pore size from 0.1 to 10 nanometers and substantially free of pores greater than 1 micrometer, and articles formed of these materials. These materials are prepared by plasma depositing a random covalent network hydrocarbon film from the plasma gas phase and then heating (i.e., annealing) the hydrocarbon thin film to drive out the hydrogen from the cross-linked network or a carbon skeleton. The density of the random covalent network can be adjusted precisely during deposition which allows the pore size and its distribution in the resulting carbon skeleton to be accurately controlled. While the present invention is not so limited, an appreciation of various aspects of the invention will be gained through a discussion of the examples provided below.

FIG. 1 is a schematic cross-sectional view of an illustrative microporous carbon material 100. The microporous carbon material 100 includes a porous carbon skeleton 115. In many embodiments, the porous carbon skeleton 115 consists essentially of carbon (e.g., is greater than 90 atomic % carbon or is greater than 95 atomic % carbon, or is greater than 99 atomic % carbon.)

The porous carbon skeleton 115 defines a plurality of pores 110. The pores 110 have an average pore size from 0.1 to 10 nanometers and the porous carbon skeleton 115 is substantially free of pores being greater than 1 micrometer. In many embodiments, the pores 110 have an average pore size from 0.1 to 10 nanometers and the porous carbon skeleton 115 is substantially free of pores being greater than 100 nanometers.

The porous carbon skeleton 115 has a porosity of 10% or greater, or 30% or greater, or 50% or greater, depending on how the porous carbon skeleton 115 is formed (described below). In many embodiments, the porous carbon skeleton 115 is optically transparent over the visible light spectrum or has an effective coefficient of extinction of less than 1, or less than 0.5, or less than 0.1 in the 400-800 nm region of the electromagnetic spectrum.

This microporous carbon material 100 has a number of desirable characteristics. This material has a high porosity (e.g., greater than 10%, or greater than 30%, or greater than 50%), uniform small pore size (e.g., less than 100 nanometers, or less than 10 nanometers), high surface area (e.g., greater than 100 m$^2$/g, or greater than 500 m$^2$/g), inert (e.g., resistant to solvents, acids, bases, and no extractables), high refractive index (e.g., greater than 1.8 to 2.2), provides a precisely tailorable film thickness, provides high thermal stability, biocompatible, electrically conducting, and transparent to visible light.

Figure 2:
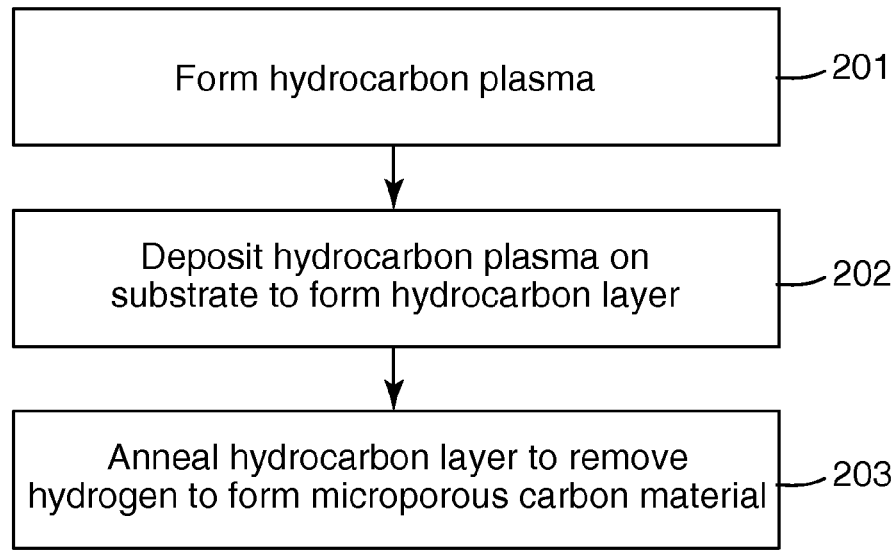
FIG. 2 is a flow diagram of an illustrative method of forming a microporous carbon material.

FIG. 2 is a flow diagram of an illustrative method of forming a microporous carbon material. At block 201 a hydrocarbon plasma is formed (as described below). In many embodiments, the plasma is formed substantially only from a hydrocarbon material. The hydrocarbon plasma is formed from a hydrocarbon gas. In some embodiments, the hydrocarbon layer has greater than 50 atomic % carbon and less than 50 atomic % hydrogen. In further embodiments, the hydrocarbon layer has greater than 50 atomic % carbon and the remainder atomic % hydrogen. These atomic percents can be determined by combustion analysis.

The hydrocarbon gas can be any formed of any useful hydrocarbon. Examples of hydrocarbons include, but are not limited straight or branched chain alkanes, alkenes, alkynes, and cyclic hydrocarbons having up to ten carbon atoms. Suitable hydrocarbons include ($C_1$-$C_{10}$)alkane, ($C_2$-$C_{10}$)alkene, or ($C_2$-$C_{10}$)alkyne hydrocarbon gas. In some embodiments, the hydrocarbon gas is, for example, methane, ethane, propane, butane, benzene, cyclohexane, toluene, ethylene, propylene, acetylene, and butadiene. In certain embodiments, the hydrocarbon gas is butane or butadiene.

At block 202, an amorphous hydrocarbon layer is formed by the hydrocarbon plasma. Then the amorphous hydrocarbon layer is annealed, at block 203, to remove hydrogen to form a microporous carbon material (described above). In many embodiments, substantially all of the hydrogen within the hydrocarbon layer is removed to form the microporous carbon material.

The crystallinity and the nature of the bonding of a carbon deposit determines the physical and chemical properties of the deposit. Diamond is crystalline, whereas the amorphous hydrocarbon films described herein are a non-crystalline, amorphous material, as determined by x-ray diffraction. Diamond is essentially pure carbon, whereas these amorphous hydrocarbon films contain essentially carbon and hydrogen. Diamond has the highest packing density, or gram atom density (GAD), of any material at ambient pressure.

Its GAD is 0.28 gram atoms/cc. These amorphous hydrocarbon films have a GAD ranging from about 0.20 to 0.28 gram atoms/cc. In contrast, graphite has a GAD of 0.18 gram atoms/cc. Diamond has an atom fraction of hydrogen of zero, while these amorphous hydrocarbon films have an atom fraction of hydrogen in a range from 0.2 to 0.8. Gram atom density is calculated from measurements of the weight and thickness of a material. "gram atom" refers to the atomic weight of a material expressed in grams.

Removal of hydrogen from the amorphous hydrocarbon layer creates pores or voids defined by a carbon skeleton. Since the GAD of these amorphous hydrocarbon layers can approach the GAD of diamond, the pore size can be designed to be very small and controllable (e.g., average 0.1 to 10 nanometers with substantially all pores less than 1 micrometer or less than 100 nanometers.

In many embodiments, a plasma deposition system includes electrodes, one or both of which are powered by RF and a grounded reaction chamber. A substrate is placed proximate the electrode and an ion sheath is formed around the powered electrode to establish a large electric field across the ion sheath. Plasma is generated and sustained by means of a power supply (an RF generator operating at a frequency in the range of about 0.001 Hz to about 100 MHz). To obtain efficient power coupling (i.e., wherein the reflected power is a small fraction of the incident power), the impedance of the plasma load can be matched to the power supply by means of a matching network that includes two variable capacitors and an inductor. In many embodiments, the substrate has a negative bias voltage or negative self-bias voltage and the voltage can be formed by direct current (DC).

Briefly, the grounded reaction chamber is partially evacuated, and radio frequency power is applied to one of two electrodes. A hydrocarbon source is introduced between the electrodes to form a hydrocarbon plasma that includes reactive species in proximity to the electrodes, and to also form an ion sheath proximate at least one electrode. The substrate is exposed to the reactive species within the ion sheath that is proximate an electrode to form a hydrocarbon layer on the substrate.

Deposition occurs at reduced pressures (relative to atmospheric pressure) and in a controlled environment. A hydrocarbon plasma is created in a reaction chamber by applying an electric field to a carbon-containing gas. Substrates on which a hydrocarbon film is to be deposited are usually held in a vessel or container in the reactor. Deposition of the hydrocarbon film can occur at rates ranging from about 1 nanometer per second (nm/second) to about 100 nm/second (about 10 Angstroms per second to about 1000 Angstoms per second), depending on conditions including pressure, power, concentration of gas, types of gases, relative size of electrodes, etc. In general, deposition rates increase with increasing power, pressure, and concentration of gas, but the rates will approach an upper limit.

Hydrocarbon species within the hydrocarbon plasma react on the substrate surface to form covalent bonds, resulting in an amorphous hydrocarbon film on the surface of the substrate. The substrate can be held in a vessel or container within an evacuable chamber that is capable of maintaining conditions that produce hydrocarbon film deposition. That is, the chamber provides an environment that allows for the control of, among other things, pressure, the flow of various inert and reactive hydrocarbon gases, voltage supplied to the powered electrode, strength of the electric field across the ion sheath, formation of a hydrocarbon plasma containing reactive hydrocarbon species, intensity of ion bombardment and rate of deposition of a hydrocarbon film from the hydrocarbon reactive species.

Prior to the deposition process, the chamber is evacuated to the extent necessary to remove air and any impurities. Inert gases (such as argon) may be admitted into the chamber to alter pressure. Once the substrate is placed in the chamber and it is evacuated, a hydrocarbon, and optionally a substance from which an additional component can be deposited, is admitted into the chamber and, upon application of an electric field, forms a hydrocarbon plasma from which the amorphous hydrocarbon film is deposited. At the pressures and temperatures of hydrocarbon film deposition (typically, about 0.13 Pascal (Pa) to about 133 Pa (0.001 to 1.0 Torr) (all pressures stated herein are gauge pressure) and less than 50 degrees centigrade), the hydrocarbon will be in the vapor form.

The electrodes may be the same size or different sizes. If the electrodes are different sizes, the smaller electrode will have a larger ion sheath (regardless of whether it is the grounded or powered electrode). This type of configuration is referred to as an "asymmetric" parallel plate reactor. An asymmetric configuration produces a higher voltage potential across the ion sheath surrounding the smaller electrode. Electrode surface area ratios can be from 2:1 to 4:1, or from 3:1 to 4:1. The ion sheath on the smaller electrode will increase as the ratio increases, but beyond a ratio of 4:1 little additional benefit is achieved. The reaction chamber itself can act as an electrode. One configuration includes a powered electrode within a grounded reaction chamber that has two to three times the surface area of the powered electrode.

In an RF-generated plasma, energy is coupled into the plasma through electrons. The plasma acts as the charge carrier between the electrodes. The plasma can fill the entire reaction chamber and is typically visible as a colored cloud. The ion sheath appears as a darker area around one or both electrodes. In a parallel plate reactor using RF energy, the applied frequency is preferably in the range of about 0.001 Megahertz (MHz) to about 100 MHz, preferably about 13.56 MHz or any whole number multiple thereof This RF power creates a plasma from the hydrocarbon gas within the chamber. The RF power source can be an RF generator such as a 13.56 MHz oscillator connected to the powered electrode via a network that acts to match the impedance of the power supply with that of the transmission line and plasma load (which is usually about 50 ohms so as to effectively couple the RF power). Hence this is referred to as a matching network.

The ion sheath around the electrodes causes negative self-biasing of the electrodes relative to the plasma. In an asymmetric configuration, the negative self-bias voltage is negligible on the larger electrode and the negative bias on the smaller electrode is typically in the range of 100 to 2000 volts.

For planar substrates, deposition of dense diamond-like thin films can be achieved in a parallel plate reactor by placing the substrates in direct contact with a powered electrode, which is made smaller than the grounded electrode. This allows the substrate to act as an electrode due to capacitive coupling between the powered electrode and the substrate.

Selection of the heating conditions of the plasma deposited amorphous hydrocarbon film allows for the tailoring of the resulting microporous carbon skeleton layer 115. For example, the resulting microporous carbon skeleton layer 115 can be either hydrophobic or hydrophilic, depending on the selected heating conditions. In some embodiments, a hydrophobic microporous carbon skeleton layer 115 can be formed by heating the plasma deposited amorphous hydrocarbon film in an inert (or reducing) atmosphere and/or at a pressure less than atmospheric. In other embodiments, a hydrophilic microporous carbon skeleton layer 115 can be formed by heating the plasma deposited amorphous hydrocarbon film in an oxidizing atmosphere such as air, oxygen or steam, and at an atmospheric or greater pressure. In some embodiments, the microporous carbon skeleton layer 115 can be formed by heating the plasma deposited amorphous hydrocarbon film in an ammonia atmosphere, as desired.

Figure 3:
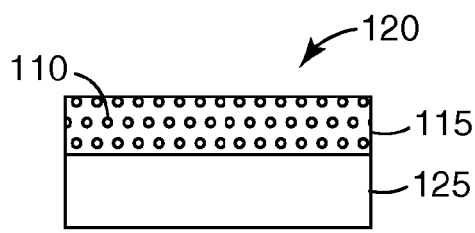
FIG. 3 is a schematic cross-sectional view of an illustrative article including a microporous carbon skeleton layer.

FIG. 3 is a schematic cross-sectional view of an illustrative article 120 including a microporous carbon skeleton layer 115 disposed on a substrate 125. The microporous carbon skeleton layer 115 defines a plurality of pores 110, as described above. The microporous carbon skeleton layer 115 can have any useful thickness such as, for example from 0.1 to 10 micrometers.

The substrate 125 can be formed of any useful material, depending on the intended use for the article 120. The substrate 125 can be a gas permeable substrate if the article 120 is used as an analyte sensor or a membrane separation or filtration element. The substrate 125 can be a light reflective and/or transmissive substrate if the article 120 is used as an analyte sensor.

Membrane separation or filtration elements utilizing the microporous carbon skeleton layer 115 described herein provides superior characteristics suitable for ultrafiltration (e.g., viral, albumin, pepsin, or Vitamin B-12 separations and the like), nanofiltration (e.g., glucose or divalent salts separation and the like) or reverse osmosis (e.g., monvalent salts or undissociated acid separation and the like). Membrane separation or filtration elements for gas separation utilizing the microporous carbon skeleton layer 115 described herein provides superior characteristics suitable for membrane based chemical separations, gas separation for hydrogen recovery, nitrogen production, and acid gas removal from natural gas streams (having a controlled 10 angstrom or less pore size and being thermally stable). The microporous carbon skeleton layer 115 described herein can be utilized as a filtration layer, a gas separation layer, or a viral filtration layer.

Analyte sensors utilizing the microporous carbon skeleton layer 115 described herein provide superior sensor characteristics such as, for example, fast response times, fast rise in response at low analyte concentrations, good response under humid conditions, and similar adsorption characteristics as compared to activated carbon media in a chemical filtration cartridge. In many embodiments, the microporous carbon skeleton layer 115 can be used to detect the presence and/or concentration of an analyte or of a mixture of analytes.

The analyte may be a gas (e.g., a vapor) or a liquid, for example. In some embodiments, the analyte is a molecule. The analyte may be present in a gaseous medium (such as, for example, air) or liquid medium (such as, for example, water). In some embodiments, the analyte is an organic molecule or organic material.

In one embodiment, the analyte is detected by a change in the optical thickness of the microporous carbon skeleton layer 115 upon exposure to the analyte. The analyte changes the optical thickness of the microporous carbon skeleton layer 115. In one embodiment the analyte is adsorbed into at least a portion of the microporous carbon skeleton layer 115. Upon adsorption of the analyte, color changes of the article 120 can indicate the presence of the analyte. In many sensor embodiments, the change in optical thickness is observable in the visible light range and can be detected by the unaided human eye. However, sensors 120 can be designed to show a change in optical thickness when subjected to other light sources or radiation sources such as, for example, ultraviolet (UV), infrared (IR), or near infrared (NIR).

A variety of detection mechanisms can also be used, but this is not required. Examples of suitable detection mechanisms include spectrophotometers, fiber optic spectrophotometers, and photo-detectors, e.g., charge coupled devices (ccd), digital cameras, and the like.

The substrate 125 is formed of one or more suitable materials capable of providing support or other functions for the microporous carbon skeleton layer 115. The substrate 125 can be flexible or non-flexible. The substrate 125 may be transparent, opaque, or reflective. The substrate 125 can be permeable to an analyte or gas or allow the analyte or gas to diffuse through the substrate 125. The substrate material can be tailored to the application. In many embodiments, it is suitable for use in a plasma deposition process. In some embodiments, the substrate 125 can block or permit transport of the analyte or gas through the substrate 125. Examples of substrates 125 that permit transport of the analyte or gas through the substrate 125 include woven and non-woven materials and permeable (or perforated or porous) solids, such as the aluminum oxide disk, and the like.

In some sensor embodiments, the sensor 120 substrate 125 is light reflective. This reflective layer can include any material that can form a fully reflective or semi-reflective layer. In many embodiments, the material is fully (e.g., greater than 90%, 95% or 99%) light reflective at a thickness of about 20 to about 200 nm to a light wavelength of interest. Thinner or discontinuous layers can be used to make the reflective layer semi-reflective. The reflective layer may be made discontinuous by wet etching, reactive ion etching, laser ablation, and the like.

A partial listing of suitable materials for the reflective layer include; metals or semi-metals such as aluminum, chromium, gold, nickel, palladium, platinum, titanium, silicon, and silver. Mixtures of metals or metal alloys may also be used, such as gold/palladium or nickel/chromium. Other suitable materials include, for example, metal oxides such as aluminum oxide, chromium oxide, and titanium oxide and nitrides such as silicon nitride, aluminum nitride, titanium nitride, chromium nitride, carbon nitride, and the like.

In some embodiments, the reflective layer is at least 90% reflective, or at least 99% reflective, to a light wavelength of interest. In other embodiments, the reflective layer is a semi-reflective layer, being 20 to 90% reflective, or 30 to 70% reflective, to a light wavelength of interest.

In some embodiments, the reflective layer has a pattern therein wherein first regions of the reflective layer have a greater light reflectance than second regions of the reflective layer. In these embodiments, the first and second regions on the reflective layer form a pattern or indicia on the upper surface of or within the reflective layer. A patterned reflective layer can include a pattern or indicia so as to create colored images, words, or messages upon exposure of the microporous carbon skeleton layer 115 to an analyte. Such patterns or indicia can provide easily identifiable warnings for a user upon exposure to an analyte.

In many sensor embodiments, the microporous carbon skeleton layer 115 optical thickness changes upon exposure to an analyte. The change in optical thickness can be caused by a dimensional change such as a change in physical thickness of the microporous carbon skeleton layer 115 or a change in refractive index of the microporous carbon skeleton layer 115. The microporous carbon skeleton layer 115 may change from one color to another, from a color to no color (e.g., silver), or from no color (e.g., silver) to a color, as desired. In some embodiments, the transition in appearance can be from/to a reflective, metallic or silvery appearance.

The sensor 120 may include one or more sub-layers (not shown). One or more of these sub-layers may be discontinuous or patterned. In some embodiments, the sub-layers can include different materials or be formed with different processing conditions and adsorb different analytes and/or may have different degrees of sensitivity to one or more analytes. The sub-layers may have a variety of configurations. For example, the sub-layers may be stacked to form a stack of two or more layers or may be positioned within the same layer in a side-by-side configuration, as desired. In some embodiments, at least one sublayer may include an inorganic material such as, for example, transparent and metal oxides, nitrides, and oxynitrides of appropriate thickness for producing color by optical interference. Specific examples of suitable inorganic materials include, silicon oxides, silicon nitrides, silicon oxynitrides, aluminum oxides, titanium oxides, titanium nitride, titanium oxynitride, tin oxides, zirconium oxides, and combinations thereof. Other inorganic materials, such as zeolites, are also suitable for use in sublayer(s). Optional sublayer(s) may be microporous, porous, or nonporous. In other embodiments, at least one sublayer may comprise a porous organic polymer. Polymers having intrinsic microporosity (PIMs) provide particularly desirable sublayers. PIMs typically are non-network polymers that form microporous solids. Due to their typically highly rigid and contorted molecular structures, PIMs are unable to fill space efficiently, thus providing the disclosed microporous structure. Suitable PIMs include, but are not limited to, polymers disclosed in "Polymers of intrinsic microporosity (PIMs): robust, solution-processable, organic microporous materials," Budd et al., *Chem. Commun.*, 2004, pp. 230-231. Additional PIMs are disclosed in Budd et al., *J. Mater. Chem.*, 2005, 15, pp. 1977-1986, in McKeown et al., *Chem. Eur. J.* 2005, 11, No. 9, 2610-2620 and in Published PCT application No. WO 2005/012397 A2.

In many embodiments, the sensor 120 includes a pattern or indicia so as to create colored images, words, or messages upon exposure to an analyte. In some embodiments, the layer or sublayer is patterned by having one or more portions that are reactive to a particular analyte and one or more portions that are non-reactive to the same analyte. In other embodiments, a pattern of reactive material may be deposited on or formed within a larger non-reactive sublayer. If formed on a non-reactive sublayer, it is preferable to make the patterned layer very thin so that no difference in optical thickness is apparent until an analyte is adsorbed. The patterning can provide easily identifiable warnings for a user upon exposure to an analyte.

Figure 4:
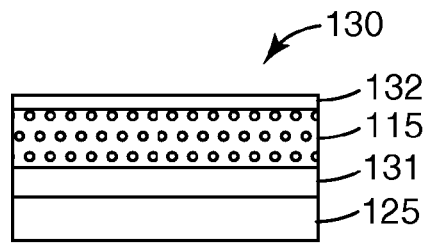
FIG. 4 is a schematic cross-sectional view of another illustrative article including a microporous carbon skeleton layer.

In some embodiments, as shown in FIG. 4, the sensor 130 is a thin-film multilayer indicator that can detect the presence of a variety of analytes. The sensor 130 includes a substrate 125, a continuous reflective layer 131, a microporous carbon skeleton layer 115 being an optically-responsive detection layer, and a semi-reflective layer 132 or a semi-continuous semi-reflective layer 132.

The term "continuous" refers to a layer of material that is non-porous and is not vapor-permeable. The term "semi-continuous" refers to a layer of material that is porous and is vapor-permeable and/or liquid permeable. The term "substantially continuous" refers to a layer of material that is non-porous but may have cracks, grain boundaries, holes, or other defects and is vapor-permeable. The term "discontinuous" refers to a layer of material has at least two separate and distinct islands of the material within a given plane with empty space therebetween, or at least two separate and distinct empty spaces (lakes) within a given plane with the material therebetween, and the layer is vapor-permeable.

The continuous reflective layer 131 can be formed using a variety of deposition techniques, including sputtering, evaporative deposition, electroplating or other electrochemical deposition, lamination or applying a suitably thick layer of a metallic paint.

The semi-reflective layer 132 can include any material that can form a permeable, semi-reflective layer and has a different index of refraction than the microporous carbon skeleton layer 115. In many embodiments, the material is semi-reflective at a thickness in a range from 5 to 10 nanometers because at this thickness most analytes will be able to permeate through this layer to the microporous carbon skeleton layer 115. Desired thicknesses will depend on the material used to form this layer, the analyte to be detected, and the medium that will carry the analyte.

Suitable semi-reflective layer 132 materials include, for example, metals and semi-metals such as aluminum, chromium, gold, nickel, palladium, platinum, titanium, silicon, and silver. Mixtures of metals or metal alloys, such as gold/palladium or nickel/chromium may also be used. Other suitable materials that may be included in the semi-reflective layer include oxides such as aluminum oxide, titanium oxide, and chromium oxide, and nitrides such as silicon nitride, aluminum nitride, titanium nitride, chromium nitride and the like.

The semi-reflective layer 132 may be a substantially continuous layer or a discontinuous layer or a semi-continuous layer. The semi-reflective layer can include one or more semi-reflective layers. In some embodiments, the semi-reflective layer is a single semi-reflective layer, which is either substantially continuous, discontinuous, or semi-continuous. In one exemplary embodiment, the semi-reflective layer is a substantially continuous layer. In this embodiment, the construction and composition of the semi-reflective layer may be substantially consistent across an upper surface of and throughout the semi-reflective layer. Alternatively, the construction and/or composition of the semi-reflective layer may vary across an upper surface of and throughout the semi-reflective layer. For example, the semi-reflective layer may have a differential permeability such that the semi-reflective layer has higher analyte permeability for a given analyte at a first location on an upper surface of the semi-reflective layer and lower analyte permeability for the same analyte at a second location on the upper surface. The first and second locations on the upper surface of the semi-reflective layer may be randomly positioned relative to one another, or may form a pattern or indicia on the upper surface.

A substantially continuous semi-reflective layer 132 may also have a pattern therein wherein first regions of the semi-reflective layer have a greater light reflectance than second regions of the semi-reflective layer 132. The first and second regions on the semi-reflective layer 132 may form a pattern or indicia on the upper surface of or within the semi-reflective layer 132. Like the patterned microporous carbon skeleton layer 115 described above, a patterned semi-reflective layer may include a pattern or indicia so as to create colored images, words, or messages upon exposure of the underlying microporous carbon skeleton layer 115 to an analyte. The semi-reflective layer can provide easily identifiable warnings for a user upon exposure to an analyte.

In a further exemplary embodiment, the semi-reflective layer 132 is a discontinuous layer. In this embodiment, the composition of the semi-reflective layer may be substantially consistent across the semi-reflective layer; however, areas separate the semi-reflective layer into two or more discontinuous regions. The discontinuous semi-reflective layer may include any pattern of semi-reflective islands within a "sea" of exposed areas (i.e., the microporous carbon skeleton layer 115 is exposed). The size and density of semi-reflective islands on the microporous carbon skeleton layer 115 may vary as desired, and may be uniformly dispersed or non-uniformly dispersed over an upper surface of the microporous carbon skeleton layer 115. The semi-reflective islands can be uniformly dispersed over an upper surface of the microporous carbon skeleton layer 115 and have at least one dimension (i.e., length, width, or diameter) of at least 5 nm, or from 10 to 1000 nm; or from 1 to 10 micrometers; however, any semi-reflective island size, shape, and density may be used. In some embodiments, the exposed areas of the microporous carbon skeleton layer 115 can have at least one dimension (i.e., length, width, or diameter) ranging from 1 to 100 micrometers; however, the exposed areas may have any dimension.

The semi-continuous semi-reflective layer 132 can contain metal nanoparticles (particles having an average particle diameter from 1 to 100 nm) arranged in a morphology which approximates a stack of cannonballs or marbles and through which liquid or vapor can permeate to reach the microporous carbon skeleton layer 115, and is formed as described in more detail below. In some embodiments, the semi-continuous semi-reflective layer 132 is applied in stripes or dots with gaps (not shown) between islands of nanoparticles, or in a layer with empty spaces or lakes in a perforated layer of nanoparticles. The stripes, dots or perforated layer are individually semicontinuous and permeable to liquid or vapor. In some embodiments, the semi-continuous semi-reflective layer 132 is overall discontinuous, and for a given layer thickness and nanoparticle diameter can have a greater liquid or vapor permeability owing to the presence of the gaps, spaces or lakes.

An analyte in the form of a liquid or vapor of interest near (e.g., above) the semi-continuous semi-reflective layer 132 can pass through the semi-continuous semi-reflective layer 132 into the microporous carbon skeleton layer 115 (i.e., detection layer). The resulting optical thickness change in the microporous carbon skeleton layer 115 brings about a visibly perceptible appearance change in the sensor 130. The change can be observed by looking at the sensor 130 through the semi-reflective layer 132. Ambient light passing through the semi-reflective layer 132 and the microporous carbon skeleton layer 115 is reflected by reflective layer 131 back through the microporous carbon skeleton layer 115 and semi-reflective layer 132. If an appropriate initial or changed thickness has been chosen for the microporous carbon skeleton layer 115, and provided that layers 131 and 132 are sufficiently flat, then interference coloration will be created or destroyed within the sensor 130 and a visibly discernible change in the appearance of the sensor 130 will be apparent when viewed through semi-reflective layer 132. Thus external equipment such as a powered light source, optical detector or spectral analysis would not be required to evaluate the condition of the sensor 130, although such external equipment may be used if desired.

A variety of metal nanoparticles may be employed in the disclosed to produce the semi-continuous semi-reflective layer 132 or chemically permeable mirror. Representative metals include silver, nickel, gold, platinum and palladium and alloys containing any of the foregoing. Metals prone to oxidation when in nanoparticle form (e.g., aluminum) might be used but desirably would be avoided in favor of less air-sensitive metals. The metal nanoparticles may be monolithic throughout or may have a layered structure (e.g., a core-shell structure such as an Ag/Pd structure). The nanoparticles may, for example, have an average particle diameter of about 1 to about 100, about 3 to about 50 or about 5 to about 30 nm. The overall thickness of the metal nanoparticle layer may, for example, be less than about 200 nm or less than about 100 nm, and the minimum layer thickness may, for example, be at least about 5 nm, at least about 10 nm or at least about 20 nm. Although large diameter microparticles might be applied to form a monolayer, the nanoparticle layer typically will be several nanoparticles thick, e.g., at least 2 or more, 3 or more, 4 or more or 5 or more nanoparticles, and with up to 5, up to 10, up to 20 or up to 50 nanoparticles total thickness. The semi-continuous semi-reflective layer 132 or metal nanoparticle reflective layer may, for example, have a reflectance of at least about 20%, at least about 40%, at least about 60% or at least about 75% at a light wavelength of 500 nm.

The semi-continuous semi-reflective layer 132 or chemically permeable mirror may be formed by applying a dilute coating solution or suspension of metal nanoparticles to the microporous carbon skeleton layer 115 or optically-responsive detection layer and allowing the solution or suspension to dry to form a semicontinuous liquid- or vapor-permeable light-reflective layer. The dilution level may, for example, be such as to provide a coating solution or suspension that will provide a suitably liquid- or vapor-permeable metal nanoparticle layer, for example solids levels less than 30 wt. %, less than 20 wt. %, less than 10 wt. %, less than 5% or less than 4%. By diluting an as-received commercial metal nanoparticle product with additional solvent and applying and drying the dilute solution or suspension, an appreciably thin, liquid- or vapor-permeable layer can be obtained. A variety of coating techniques can be employed to apply the metal nanoparticle solution or suspension, including swabbing, dip coating, roll coating, spin-coating, spray coating, die coating, ink jet coating, screen printing (e.g., rotary screen printing), gravure printing, flexographic printing and other techniques that will be familiar to persons having ordinary skill in the art. Spin-coating may provide a thinner, more permeable coating than is obtained using other methods. Accordingly, some silver nanoparticle suspensions available at low solids levels (such as 5 wt. % SVW001 silver from Nippon Paint or 10 wt. % SILVERJET DGH-50, DGP-50 from Advanced Nano Products) might be usable in the as-received form without further dilution if spin-coated at an appropriately high speed and temperature onto a suitable substrate. The metal nanoparticle layer may be sintered after it has been applied (e.g., by heating at about 125 to about 250° C. for about 10 minutes to about 1 hour) so long as the sintering does not cause a loss of adequate permeability. It will be understood that the resulting reflective layer may no longer contain readily-identifiable nanoparticles, but that it may be referred to as a nanoparticle reflective layer to identify the manner in which it has been made.

This disclosed sensor 120 or 130 may be used alone or may be part of a device for detecting the presence and/or concentration of one or more analytes. In one embodiment, the sensor 120 or 130 is at least partially enclosed by a housing. The housing can include at least one opening positioned above the semi-reflective layer or microporous carbon skeleton layer 115 so that the semi-reflective layer or microporous carbon skeleton layer 115 is viewable through the at least one opening in the housing. In some embodiments, the housing includes at least one opening, wherein the opening provides a restricted view of an upper surface of the semi-reflective layer or microporous carbon skeleton layer 115 so as to minimize any potential change in the viewable color of the sensor (and confusion of the user as to the sensor reading) due to the angle of view. In some embodiments, the restricted view allows a view of the upper surface of the semi-reflective layer or microporous carbon skeleton layer 115 within an angle of ±30 degrees or ±15 degrees from a normal view (i.e., a view from a position perpendicular to the outer surface of the semi-reflective layer or microporous carbon skeleton layer 115).

Sensors 120 or 130 described herein can be used in a system including the sensor, a light source, and, optionally, a means of (a device for) monitoring the sensor for a change of color. The light source can be a natural and/or artificial light source. The monitoring can be done in a variety of ways. It could be done visually, with a photo-detector, or by other suitable means.

The analyte to be detected by the microporous carbon skeleton layer 115 may be present in a vapor or liquid medium. For example, an analyte may be present in the atmosphere or in a liquid solvent. In either case, in many embodiments, at least a portion of the analyte permeates through the semi-reflective layer 132 (if present) of the sensor to interact with the microporous carbon skeleton layer 115.

Two or more sensors 120 or 130 may be used together to form an array. The array may be in any suitable configuration. For example, an array may include two or more sensors side by side, or the sensors can be attached to, or constructed on, opposite sides of a substrate. The sensors within a given array may be of the same type or may be different. Arrays of sensors would be useful for identification of analytes, based upon their unique response signatures from the array in aggregate, as opposed to only detecting the presence of a chemical agent.

The sensors 120 or 130 can have many useful applications, e.g., to detect a wide range of organic vapors, for example. The sensors may be used to detect the presence and/or concentration of a given analyte within a solution or gas. Sensor arrays may be used to detect the presence and/or concentration of one or more analytes within a solution or gas.

In many embodiments, prior to use, the multi-layered film sensors described herein are substantially free of an analyte to be detected. The "unexposed" sensor prior to use can display a first color or be colorless (silver) when viewed through the semi-reflective layer (if present). Upon exposure to one or more analytes to be detected, the "unexposed" sensor converts to an analyte-containing calorimetric sensor. The analyte-containing calorimetric sensor either (i) displays a second color that is different from the first color, or (ii) undergoes a color change from a first color to a silver (or colorless) condition.

EXAMPLES

Plasma deposited layers described herein were deposited in two different systems:

1.) MARC1 Plasma system: This built system was pumped by a turbomolecular pump (Balzers, Model TPH2000) backed by dry pumping station (Edwards roots pump EH1200 and a iQDP80 dry mechanical pump). The flow rate of gases was controlled by MKS digital flow controllers. Rf power was delivered at a frequency of 13.56 Mhz from a 3 kW RFPP power supply (Advanced Energy Model RF30H) through a matching network. The base pressure in the chamber prior to deposition of the hydrocarbon layers was IE-5 Torr. Substrate samples were taped to the electrode by using kapton tape.

2.) Plasmatherm Batch Reactor: This is a commercial batch plasma system (Plasmatherm Model 3032) configured for reactive ion etching (RIE) with a 26-inch lower powered electrode and central gas pumping. The chamber is pumped by a roots blower (Edwards Model EH1200) backed by a dry mechanical pump (Edwards Model iQDP80). Rf power is delivered by a 5 kW, 13.56 Mhz solidstate generator (RFPP Model RF50S0 through an impedance matching network. The system has a nominal base pressure of 5 mTorr. The flow rates of the gases are controlled by MKS flow controllers. Substrates for deposition are placed on the lower powered electrode.

Example 1

Synthesis of Nanoporous Carbon Film from Butadiene Gas

In this example, the MARC1 plasma system was used to first deposit a random covalent network hydrocarbon thin film from butadiene precursor gas. Annealing of this film causes dehydrogenation, leading to a nanoporous carbon film. Silicon substrate samples were taped onto the powered electrode and the chamber was pumped down to its base pressure. The substrate samples were initially primed in an argon plasma to enable good adhesion of the plasma-deposited hydrocarbon film to the substrate. The conditions of the argon plasma priming are as follows:
Argon flow rate: 400 sccm
Pressure: 5 mTorr
Rf Power: 1000 watts
DC Self-Bias Voltage: −1052 Volts
Duration of treatment: 45 seconds Deposition of Random Covalent Network Hydrocarbon Film: After priming the substrates in an argon plasma, the hydrocarbon film was plasma-deposited by feeding 1,3-butadiene gas into the vacuum chamber. The conditions of plasma deposition are as follows:
Flow rate of 1,3-butadiene: 160 sccm
Process pressure: 20 mTorr
Rf power: 100 watts
DC Self-Bias Voltage: −260 to −192 Volts
Deposition time: 16 minutes After completion of the run, a plasma-deposited hydrocarbon film having a thickness of 900 nm was obtained on the silicon wafer.

Annealing of the Hydrocarbon Film: The silicon substrate samples with the plasma-deposited hydrocarbon film were annealed in a vacuum oven at 450 degrees centigrade for one hour. Annealing leads to dehydrogenation, resulting in a microporous (i.e., nanoporous) thin film carbon material. Only a small color change is typically seen despite the large amount of porosity created. This is because the decrease in refractive index created by the porosity is compensated by a large increase in the refractive index of the carbon skeleton left behind.

Example 2

BET Analysis of Nanoporous Carbon Film Flakes

Nanoporous carbon film flakes were made according to the method described in Example 1 except that the precursor plasma polymer film was grown directly on the aluminum electrode for a prolonged period of 30 minutes without going through the argon priming step. This allowed the plasma deposited hydrocarbon film to delaminate into flakes. The flakes were scraped off from the electrode and annealed in the vacuum oven according to the procedure described in Example 1. The mass of hydrocarbon film flakes collected was 52.2 mg and upon annealing, this mass reduced to 37.2 mg due to the dehydrogenation of the hydrocarbon film flakes. The color of the flakes changed from yellow brown to black indicating the transformation to pure carbon. The nanoporous carbon flakes were characterized for pore size distribution using nitrogen ($N_2$) adsorption on a Autosorb-1 (Quantachrome Instruments) from relative pressures $P/P_0$ from 7×10-7 to 1 at a bath temperature of 77.35° K to generate an isotherm. The ambient temperature for the experiment was 297.57° K and barometric pressure was 733.35 mmHg°. The total analysis took 1299.2 minutes for a sample size of 31.9 mg. The data set thus obtained was analyzed with the software provided by Quantachrome (Autosorb v 1.51) using the Saito-Foley (SF) method and Density Functional Theory (DFT) method with a Non-Local DFT hybrid kernel for N2 on carbon cylindrical pores at equilibrium. The two methods produced pore size distributions that are in good agreement.

Figure 5:
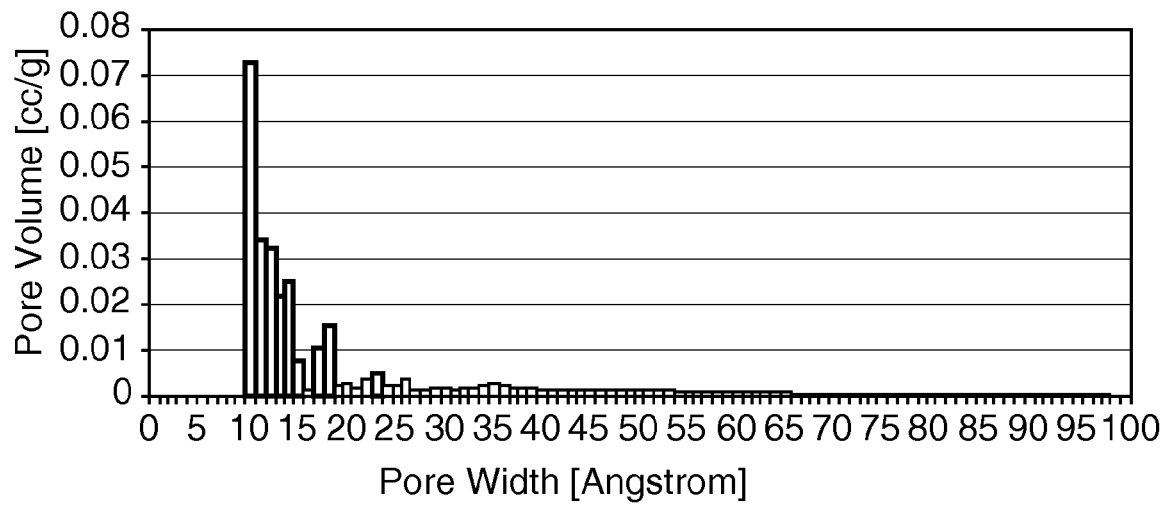
FIG. 5 is a pore distribution histogram of the microporous carbon material formed in Example 2.

The Dubinin-Astakhov (DA) and Dubinin-Raduskevich (DR) methods produced comparable results. The results of the BET analysis are shown below and in FIG. 5. From these results, it may be noted that the surface area of the nanoporous carbon is extremely high (637 m$^2$/g) with the most surface area contributions coming from pores with 5-10 Angstom sizes. Furthermore, all the contribution to surface area is from pores less than 100 Angstroms. This proves the efficacy of the nanoporous carbon film for various applications where uniform small pore size is beneficial and required.

Surface Area Data
Multipoint BET . . . 6.372E+02 m$^2$/g
t-Method External Surface Area . . . 1.732E+02 m$^2$/g
t-Method Micro Pore Surface Area . . . 4.640E+02 m$^2$/g
NLDFT Method Cumulative Surface Area . . . 6.034E+02 m$^2$/g
Pore Volume Data
Total Pore Volume for pores with Diameter less than 5055.7 Å at P/Po=0.99623 . . . 3.518E−01 cc/g
t-Method Micro Pore Volume . . . 1.415E−01 cc/g
SF Method Cumulative Pore Volume . . . 2.557E−01 cc/g
NLDFT Method Cumulative Pore Volume . . . 3.056E−01 cc/g
Pore Size Data
SF Method Pore Diameter (Mode). . . 8.490E+00 Å
NLDFT method Pore Diameter (Mode). . . 6.272E+00 Å

Example 3

Optical Properties of the Nanoporous Carbon Films

Figure 6:
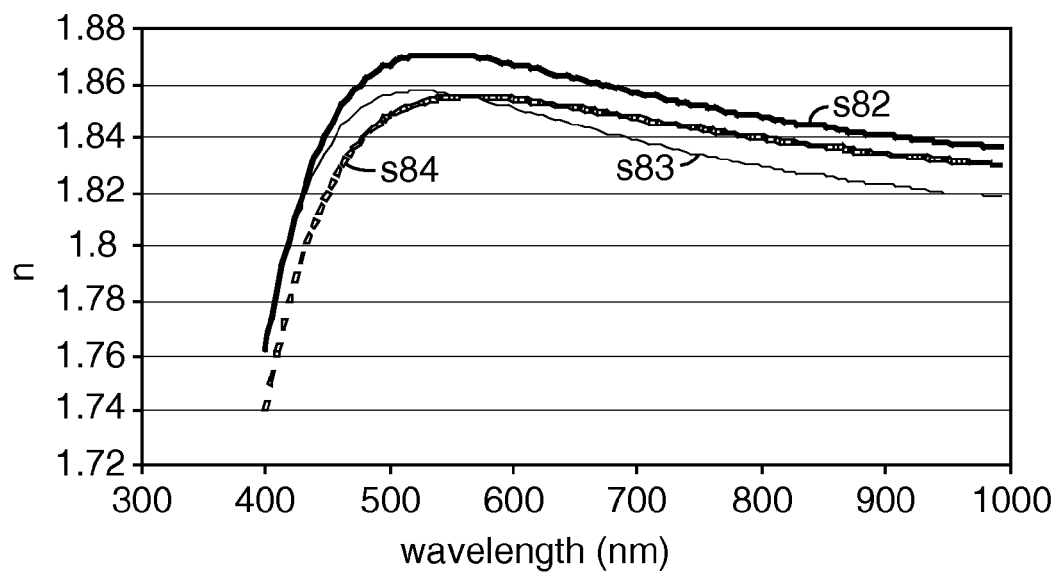
FIG. 6 is the real part of the refractive index graph of the microporous carbon material of Example 3.
Figure 7:
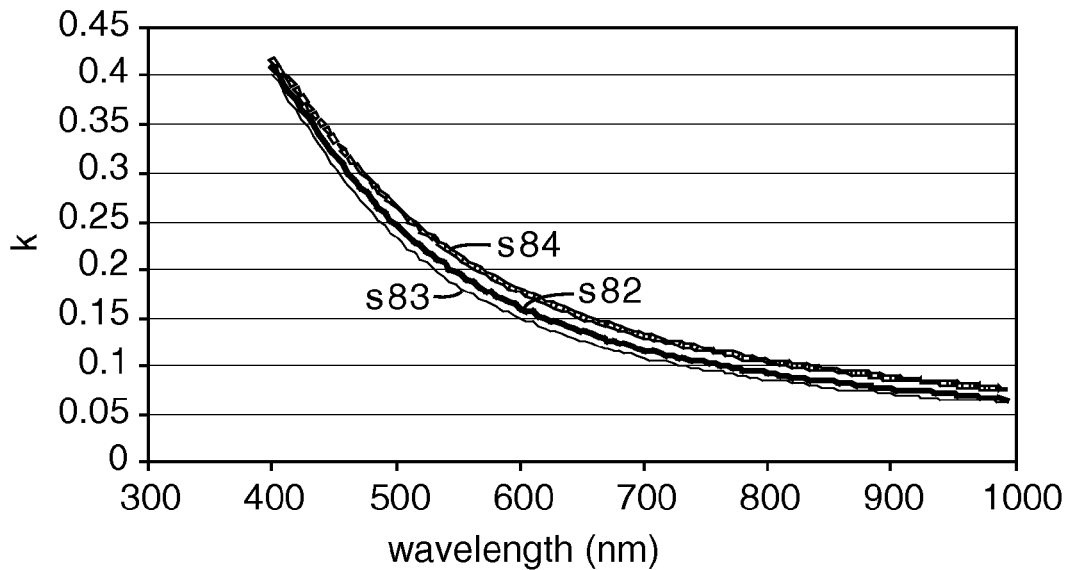
FIG. 7 is the imaginary part of the refractive index graph of the microporous carbon material of Example 3.

The microporous (i.e., nanoporous) carbon material films were characterized by Variable Angle Spectroscopic Ellipsometery (VASE) and an estimate of the porosity was made for three different films made according to example 1 but with the power maintained at 50 watts and varying amounts of deposition time (32 minutes for sample 82, 24 minutes for sample 83 and 16 minutes for sample 84). The real and imaginary parts of the refractive index are shown in FIG. 6 and FIG. 7, respectively. The thicknesses and porosities are summarized in the table below.

| sample | thickness (nm) | % void |
|---|---|---|
| s82 | 836 ± 1 | 58 |
| s83 | 632 ± 1 | 51 |
| s84 | 409 ± 1 | 48 |

The porosity values are higher here than in the BET results obtained separately. Isolated void space which might not be measured by BET may be measured by RSE. In sensors, the connectivity/porosity is more important than simply the % void space. The above values of porosity and associated refractive indexes can be achieved if the skeleton of the nanoporous carbon film has a refractive index in the order of 2.4-2.5.

Example 4

Vapor Sensing Properties of the Nanoporous Carbon Thin Film

A sample of plasma-deposited hydrocarbon film (Sample #59—formed in accordance with Example 1) was tested against a range of challenge concentrations for toluene, methyl ethyl ketone, isopropanol. A syringe pump delivers organic liquid at a constant rate to an electrically heated evaporator. The evaporator volatilizes the liquid and the vapor mixes with the main air stream. The pump is adjusted to deliver the liquid flow rate necessary to achieve the desired concentration at the selected main air flow rate. The vapor/air mixture then flows into the test chamber.

The equation below is used to calculate the volumetric flow of liquid (in mL/min) necessary to achieve a desired ppm concentration at any set total volumetric flow rate (in L/min). Test conditions assumed are 740 mm Hg pressure and 296 K temperature.

$$\begin{aligned} \text{required\_adsorbate\_flow} \\ \text{(in mL/min)} \end{aligned} = ppm \times \frac{\text{mol\_weight}}{\text{liq\_den}} \times \frac{\text{vol\_air\_flow}}{10^6} \times \frac{1}{\text{mole\_vol}}$$

$$= ppm \times \frac{153.8}{1.594} \times \frac{\text{vol\_air\_flow}}{10^6} \times \frac{1}{24.9}$$

$$= (3.87 \times 10^6) \times ppm \times \text{vol\_air\_flow}$$

Figure 8:
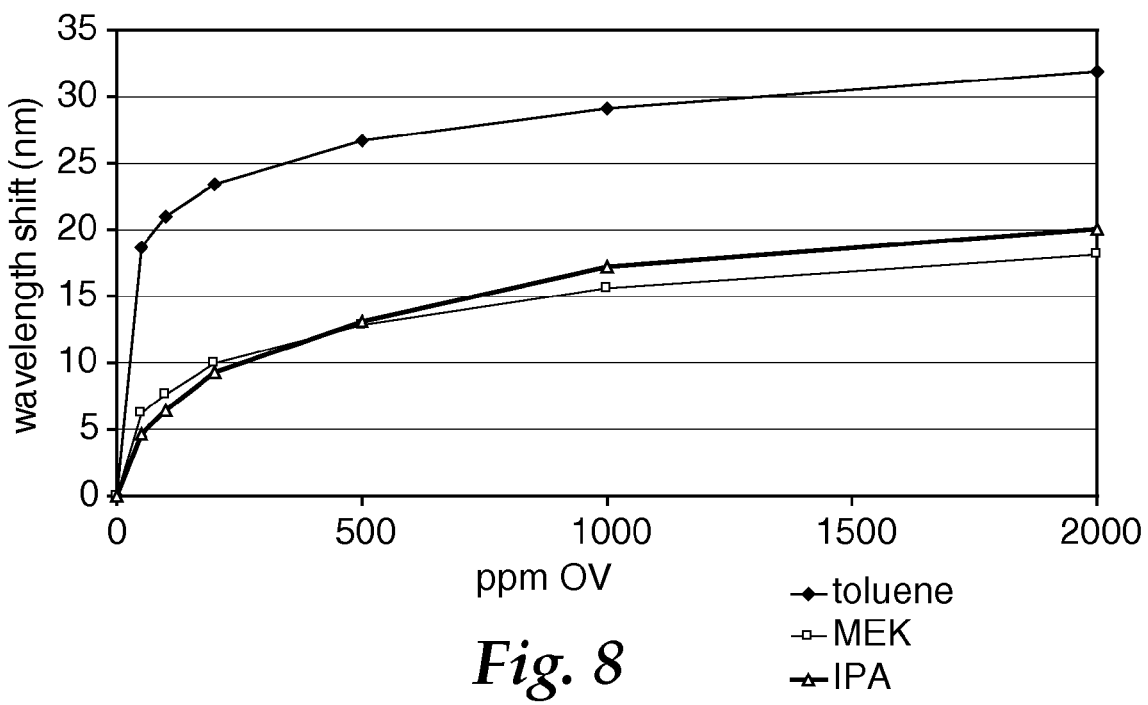
FIG. 8 is the organic vapor response graph of the microporous carbon material of Example 4.
Figure 9:
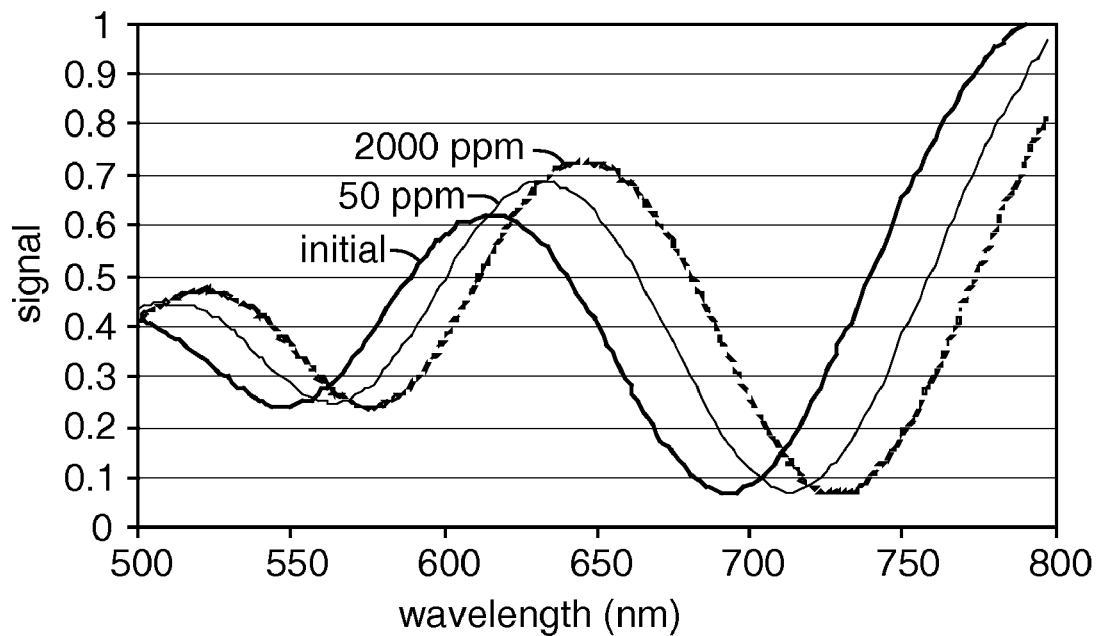
FIG. 9 is the toluene spectral response graph of the microporous carbon material of Example 4.

Additionally, the sample was observed at various levels of relative humidity, which is generated by passing the air stream over a heated water bath. The humidity is monitored with an in-line meter. The sample was challenged with ethylbenzene at 85% RH using the systems described above. The optical spectrum of the sample is monitored with an Ocean Optics light source (tungsten halogen, R-LS-1), reflection probe, and spectrometer (USB-2000). The percentage transmission is calculated relative to a silicon reference. Sample #59 was sensitive to low concentrations of toluene, methyl ethyl ketone, and isopropanol (see FIG. 8). As the vapor concentration increases, the peak wavelength shifts to the red, indicative of increasing optical thickness of the sample (see FIG. 9). The wavelength shift is greater than 10 nm at the TLV (Threshold Limit Value) for all of these vapors.

Figure 10:
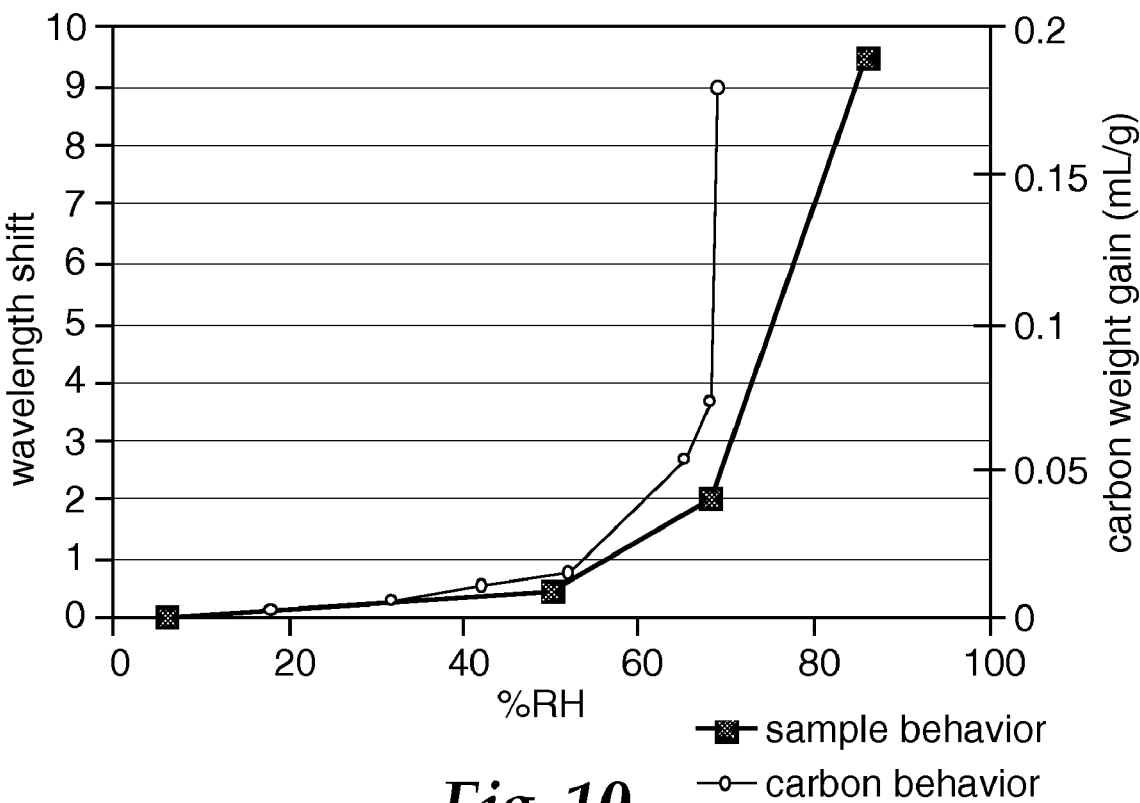
FIG. 10 is the humidity response graph of the microporous carbon material (sample) of Example 4 verses carbon.

When tested against various levels of humidity, the material shows behavior similar to that of activated carbon. As shown in FIG. 10, at low levels of humidity there is little response, followed by a small uptake of water between 50 and 70% RH, and significant water adsorption above 70% RH. Despite the uptake of water vapor, when challenged with ethylbenzene in 85% RH airstream, the sample showed significant response to the ethylbenzene, red-shifting 20 nm at the 50 ppm level. In responding to organic vapors, the film shows a "hockey stick" behavior, with a significant portion of the total response occurring at low concentration levels. This behavior is comparable to the well-known adsorptive behavior of microporous carbon.

Example 5A

Synthesis of Nanoporous Carbon Film from Butane Gas

In this example, the Plasmatherm reactor was used to first make a plasma-deposited hydrocarbon film from butane precursor gas. Silicon substrates were placed on the lower powered electrode and a plasma-deposited hydrocarbon polymer film was deposited. The substrate samples were initially primed in an oxygen plasma to enable good adhesion of the plasma-deposited hydrocarbon film to the substrate. The conditions of the oxygen plasma priming are as follows:

Oxygen Plasma Priming:
Oxygen flow rate: 500 sccm
Pressure: 25 mTorr
Rf Power: 2000 watts
Duration of treatment: 30 seconds Deposition of Hydrocarbon Film: After priming the substrates in an argon plasma, plasma-deposited hydrocarbon films of different thicknesses were deposited by feeding butane gas into the vacuum chamber. The conditions of deposition are as follows:
Flow rate of butane: 200 sccm
Process pressure: 100 mTorr
Rf power: 2000 watts, pulsed @90 ms on time, 90% duty cycle
Deposition time: 2 min 50 sec (Sample 66)

After completion of the run, hydrocarbon films having thicknesses in the order of 400-500 nm were obtained. These were annealed according to the following conditions:
Annealing Ambient: Argon gas flowing at 500 sccm
Pressure: 5.1 Torr
Annealing Temp: 520 C
Annealing Time: 20 min and 60 min (for samples labeled as "L")

Figure 11:
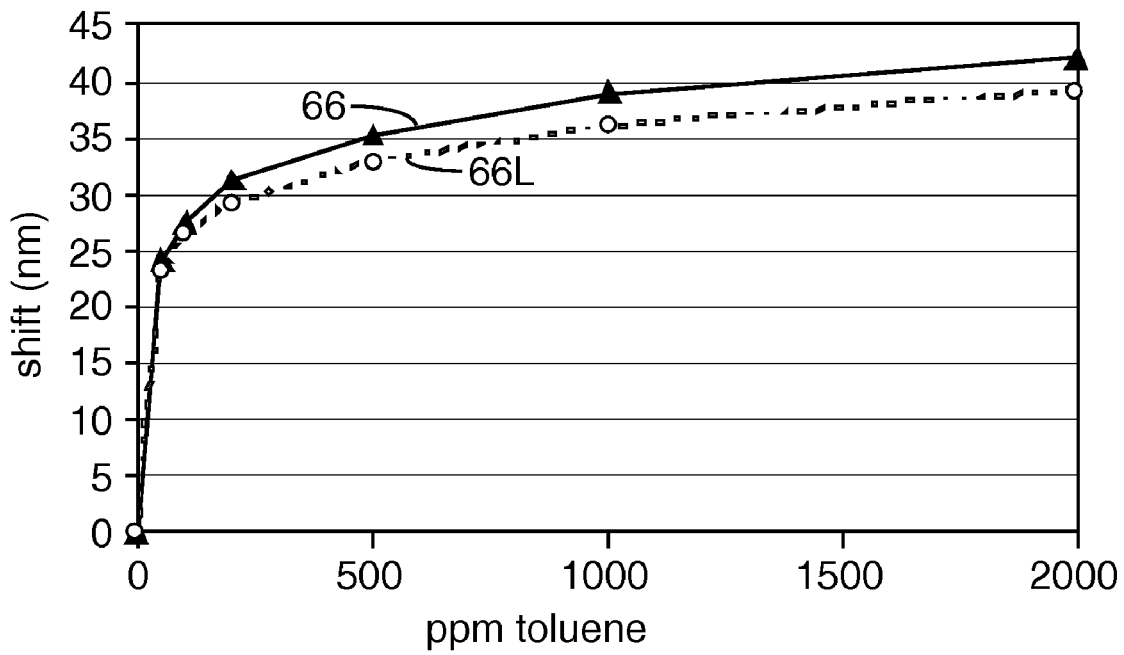
FIG. 11 is the toluene response graph of the microporous carbon material of Example 5A.
Figure 12:
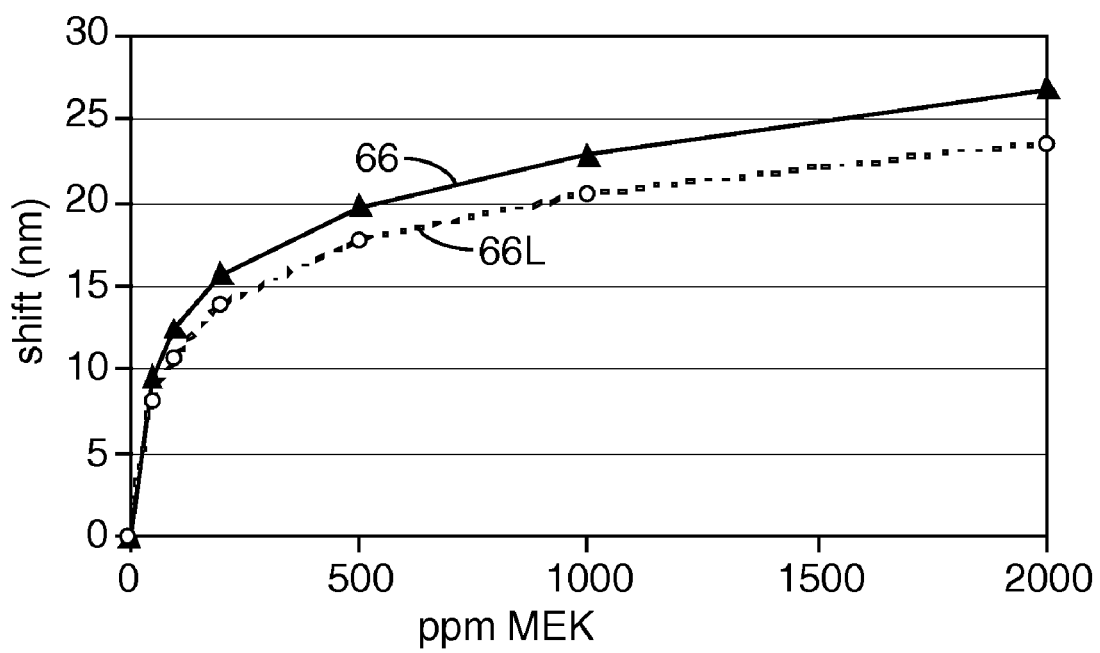
FIG. 12 is the methyl ethyl ketone (MEK) response graph of the microporous carbon material of Example 5A.
Figure 13:
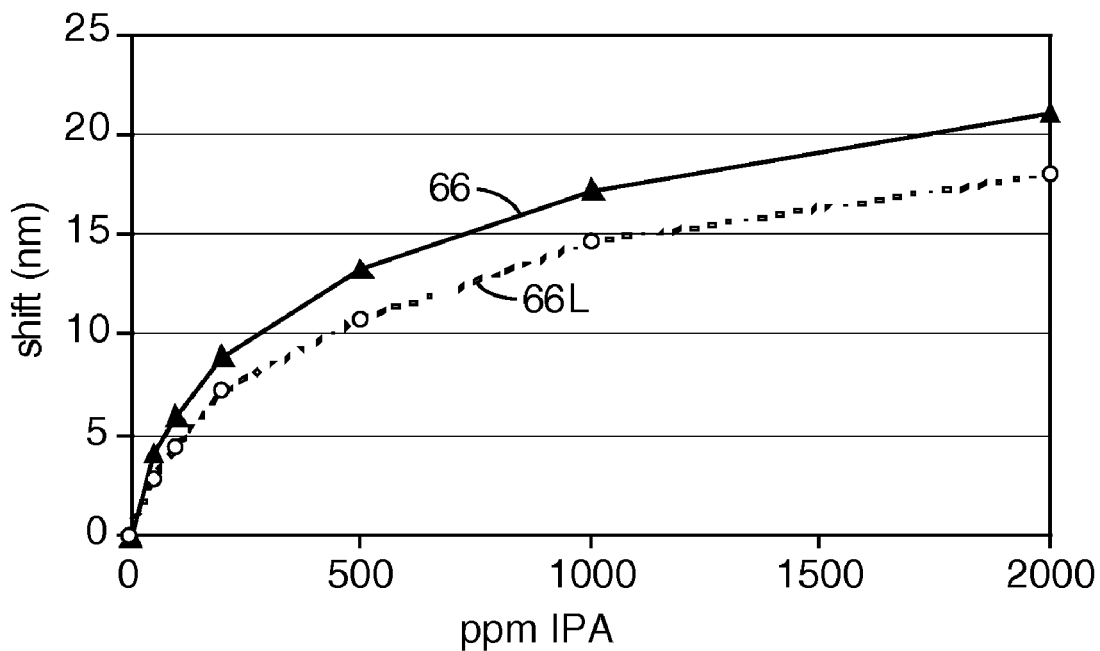
FIG. 13 is the isopropyl alcohol (IPA) response graph of the microporous carbon material of Example 5A.
Figure 14:
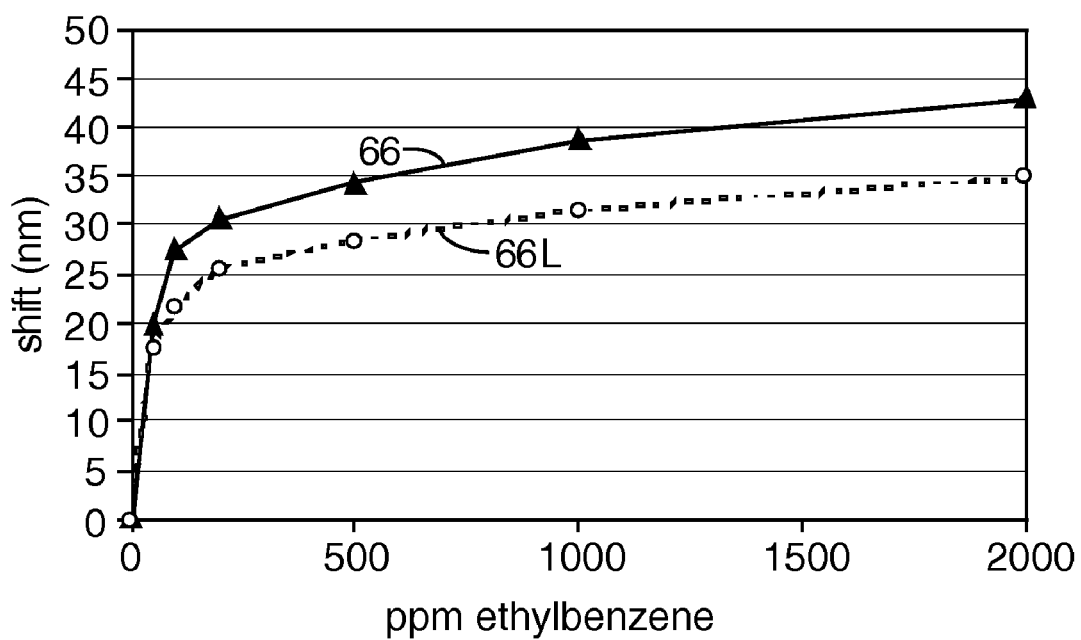
FIG. 14 is the ethylbenzene response graph of the microporous carbon material of Example 5A.

The sensing response of these microporous (i.e., nanoporous) carbon material films are shown in FIG. 11 for toluene, FIG. 12 for MEK, FIG. 13 for IPA, and FIG. 14 for ethylenebenzene with 85% RH. For the ethylbenzene test, the air stream was humidified to 85% RH and a new spectral baseline was established prior to introduction of ethylbenzene in the airstream.

Example 5B

Optical Properties of Nanoporous Thin Films

Figure 15:
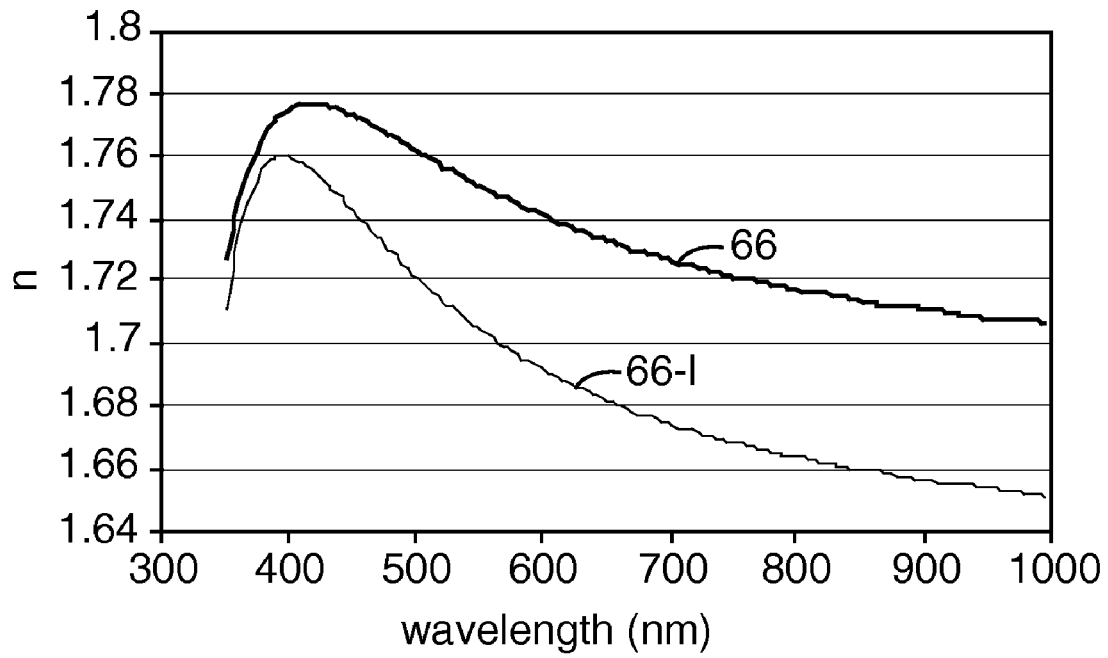
FIG. 15 is the refractive index n graph of the microporous carbon material of Example 5B.
Figure 16:
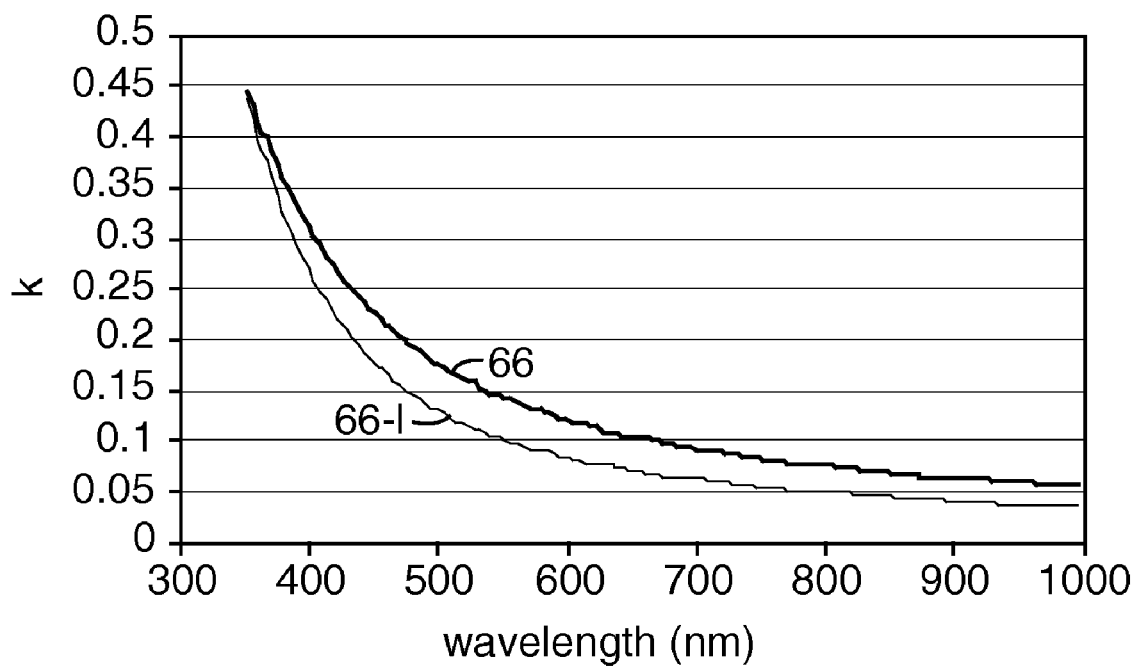
FIG. 16 is the refractive index k graph of the microporous carbon material of Example 5B.

The nanoporous carbon films from Example 5A were characterized by Variable Angle Spectroscopic Ellipsometery (VASE). The real (n) and imaginary (k) parts of the refractive index are shown in FIG. 15 and FIG. 16, respectively.

Example 6

Nanoporous Carbon Film Sensor on Porous Ceramic Substrate

Figure 17:
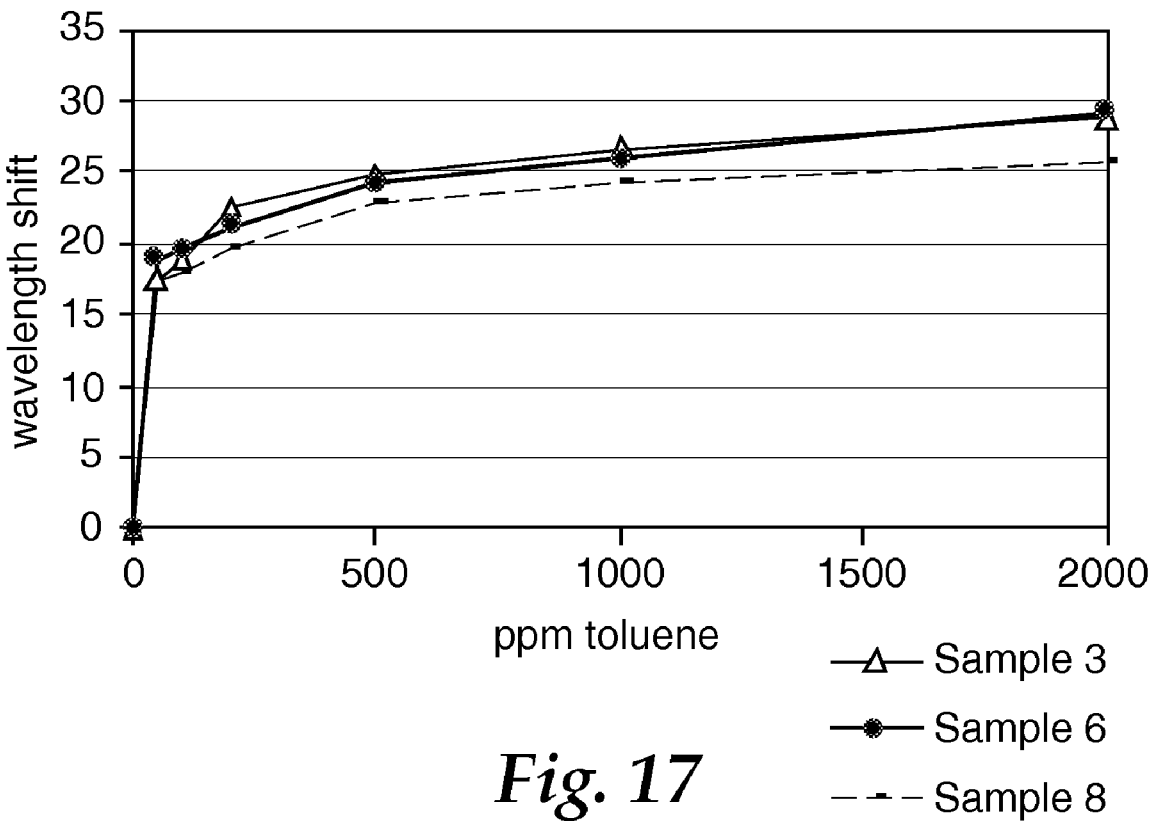
FIG. 17 is the toluene spectral response graph of the microporous carbon material of Example 6.

In this example, microporous (i.e., nanoporous) carbon film were prepared according to example 1 on a porous ceramic substrate (Creavis Alumina Substrate Z450S) with a 0.45 micrometer pore size and the vapor sensing properties were evaluated. During deposition of the plasma-deposited hydrocarbon films, the power was maintained at 50 watts instead of the 100 watts described in example 1 and the deposition time was 24 minutes instead of 18 minutes. The plasma-deposited hydrocarbon films were annealed at 500 degrees centigrade for 1 hour in a vacuum oven with flowing argon gas at 11 Torr pressure. The results are plotted in FIG. 17 for the sensing of toluene vapor. A good detection capability of 17-19 nm of wavelength shift was observed at a toluene concentration of 50 ppm.

Example 7

Power Thickness Response of Nanoporous Carbon Films

Figure 18:
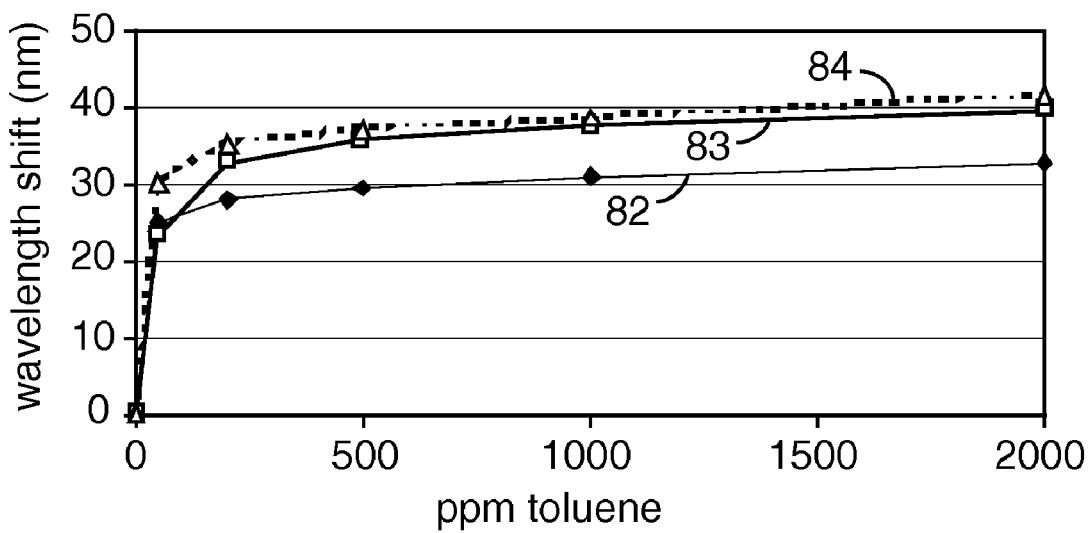
FIG. 18 is the toluene spectral response graph of the microporous carbon material of Example 7.
Figure 19:
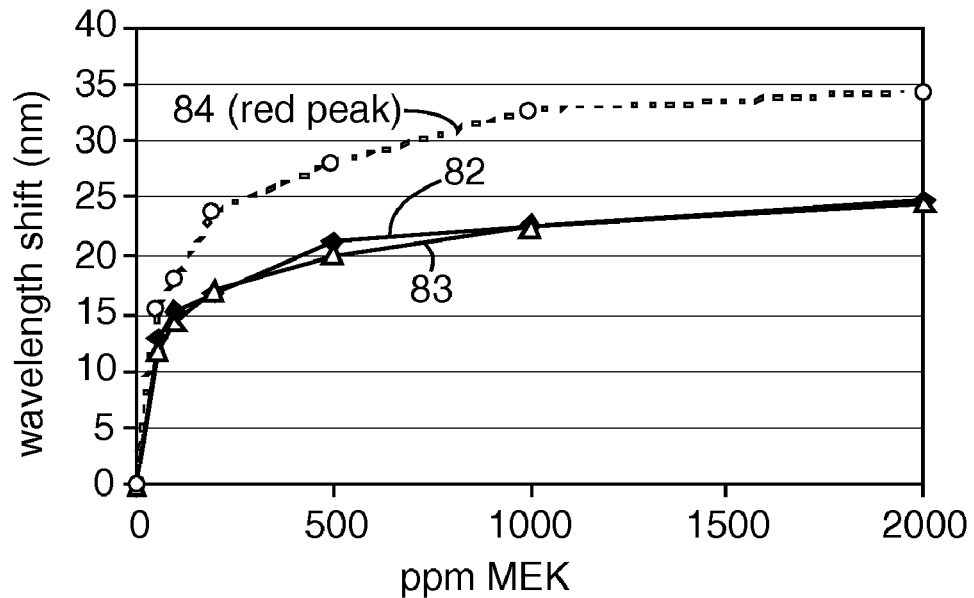
FIG. 19 is the MEK spectral response graph of the microporous carbon material of Example 7.

In this example, microporous (i.e., nanoporous) carbon material films were made according to example 1 except that the power and deposition time were varied to obtain films of varying thicknesses and the sensing response of the films to toluene and MEK vapors were measured. The conditions of deposition and annealing are described in Table 1 below and the sensor response is shown in FIG. 18 for toluene and in FIG. 19 for MEK. The table below shows sample numbers 82-90 and the associated annealing conditions for each sample. From the results in may be seen that an outstanding wavelength shift of 30 nm can be seen for toluene vapor and 15 nm for MEK vapor.

| Parameters for Samples 82–90 | | | | |
|---|---|---|---|---|
| Sample | Power (W) | Temperature (C.) | Time (hrs) | Thickness (nm) |
| 82 | 50 | 590 | 2 | 1150 |
| 83 | 50 | 590 | 2 | 850 |
| 84 | 50 | 590 | 2 | 550 |
| 85 | 30 | 460 | 1 | 1150 |
| 86 | 30 | 460 | 1 | 850 |
| 87 | 30 | 460 | 1 | 550 |
| 88 | 10 | 460 | 1 | 1150 |
| 89 | 10 | 460 | 1 | 850 |
| 90 | 10 | 460 | 1 | 550 |

Example 8

Synthesis of Nanoporous Carbon Film from Butane Gas, Ammonia Annealed, Sample 158B In this example, the Plasmatherm reactor was used to first make a plasma-deposited hydrocarbon film from butane precursor gas. Silicon substrates were placed on the lower powered electrode and a plasma-deposited hydrocarbon film was first deposited. The substrate samples were initially primed in an oxygen plasma to enable good adhesion of the plasma-deposited hydrocarbon film to the substrate. The conditions of the oxygen plasma priming are as follows:

Oxygen Plasma Priming:

| | |
|---|---|
| Oxygen flow rate: | 500 sccm |
| Pressure: | 25 mTorr |
| Rf Power: | 3000 watts |
| Duration of treatment: | 30 seconds |

Deposition of Plasma-Deposited Hydrocarbon Film: After priming the substrates in an oxygen plasma, plasma-deposited hydrocarbon films of different thicknesses were deposited by feeding butane gas into the vacuum chamber. The conditions of deposition are as follows:

| | |
|---|---|
| Flow rate of butane: | 200 sccm |
| Process pressure: | 50 mTorr |
| Rf power: | 3000 watts, pulsed @ 90 ms on time, 90% duty cycle |
| Deposition time: | 190 seconds |

After completion of the run, films having thickness of 435 nm was obtained. This hydrocarbon film was annealed according to the following conditions:

| | |
|---|---|
| Annealing Ambient: | Ammonia gas flowing at 500 sccm |
| Pressure: | 5.2 Torr |
| Annealing Temp: | 500 C. |
| Annealing Time: | 20 min |

Figure 20:
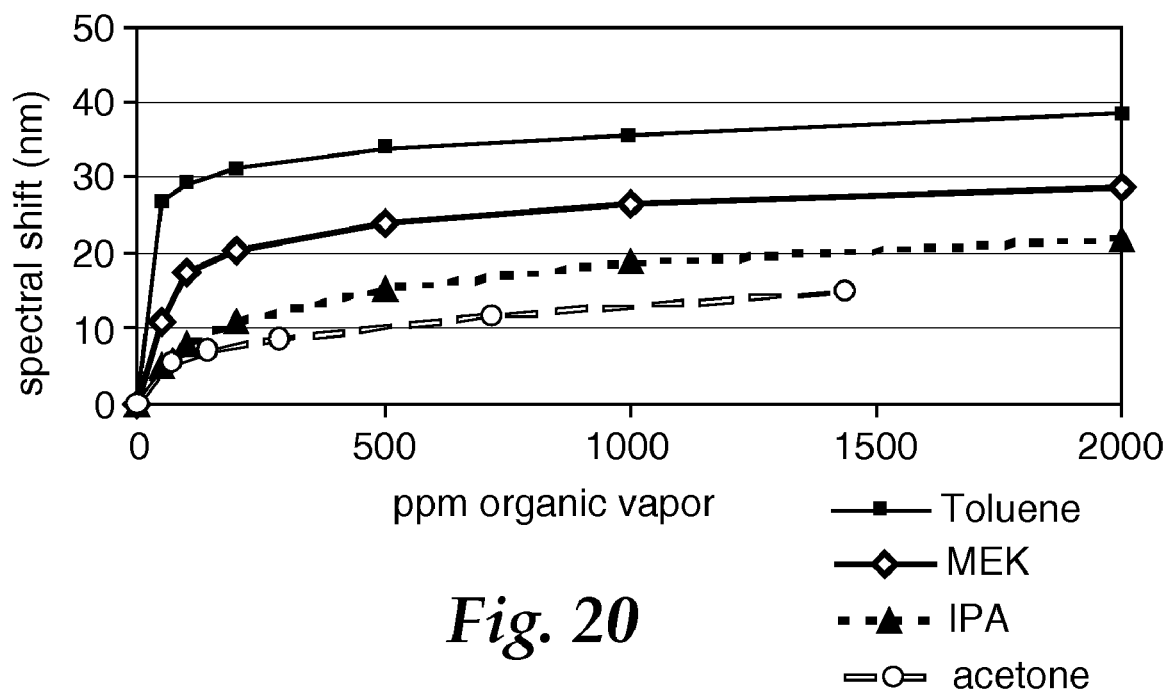
FIG. 20 is the organic vapor response graph of the microporous carbon material of Example 8.

The sensing response of these nanoporous carbon films was measured as described in Example 4 above. Sample 158B was sensitive to low concentrations of toluene, methyl ethyl ketone, isopropanol, and acetone (FIG. 20). As the vapor concentration increases, the peak wavelength shifts to the red, indicative of increasing optical thickness of the sample. The wavelength shift is 10 nm or greater at the TLV (Threshold Limit Value) for all of these vapors.

Figure 21:
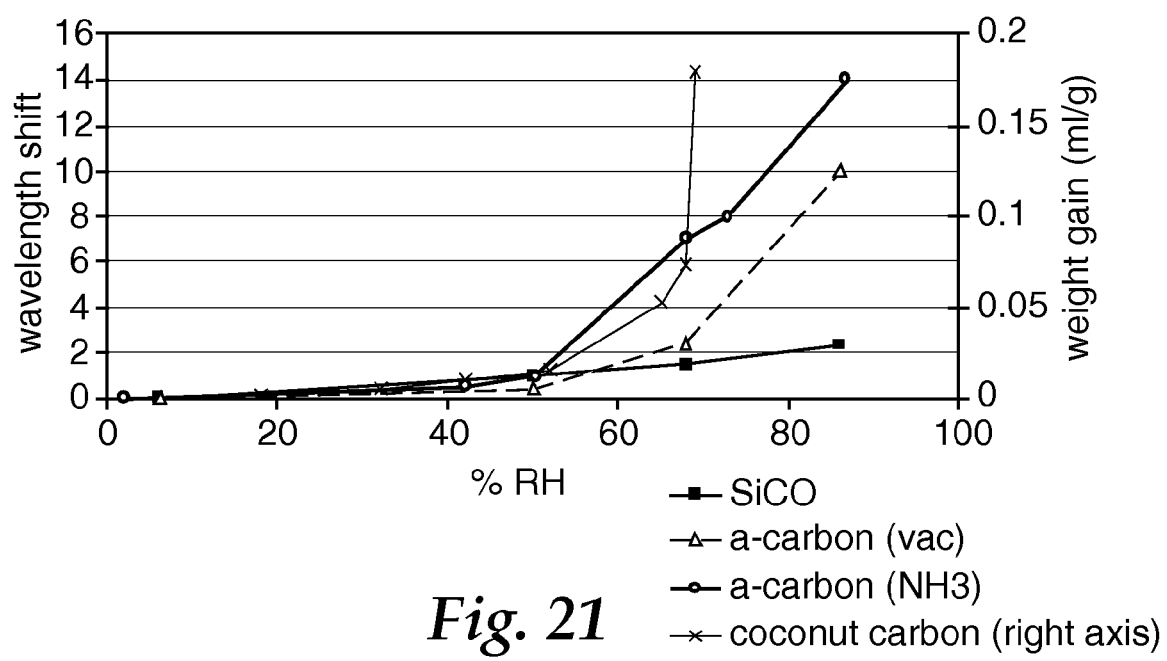
FIG. 21 is the humidity response graph of the microporous carbon material (a-carbon) of Example 8 verses coconut carbon and a silicon/carbon/oxygen plasma deposited film (SiCO).

The humidity sensitivity of sample 158B, which was annealed in ammonia, is shown in comparison to a SiCO film (a plasma deposited film microporous film including silicon/carbon/oxygen), a vacuum-annealed amorphous carbon film (PMS-58), and the weight uptake of water by coconut-shell sourced activated carbon (FIG. 21). The data show that the annealing environment affects the response of amorphous carbon to water, hence the annealing environment can be used to tailor the sensing properties of the film to a specific application.

Example 9

Nanoporous Carbon Film Enhanced Filters

This example demonstrates the applicability of microporous (i.e., nanoporous) carbon films for filtration applications. By starting with a thermally stable flexible ceramic membrane (Creavis alumina ceramic membrane Z100S and Z25S with 100 nm and 25 nm pore size), a diamond-like carbon film was first deposited onto the membrane according to example 5. The deposition time was 10 minutes. This film was then annealed in an argon atmosphere with the pressure maintained at 5 Torr and an annealing temperature of 560 degrees C. for 15 minutes. The samples turned black as the nanoporous carbon film was formed on the ceramic membrane.

Thus, embodiments of the PLASMA DEPOSITED MICROPOROUS CARBON MATERIAL are disclosed. One skilled in the art will appreciate that embodiments other than those disclosed are envisioned. The disclosed embodiments are presented for purposes of illustration and not limitation, and the present invention is limited only by the claims that follow.

What is claimed is:

1. A microporous carbon material suitable for use as a sensor, comprising:
a porous carbon skeleton having an average pore size from 0.1 to 10 nanometers and being substantially free of pores greater than 1 micrometer;
wherein the porous carbon skeleton has an effective coefficient of extinction of less than 0.5, and
wherein the refractive index of the microporous carbon material changes in the presence of an adsorbed analyte.

2. A microporous carbon material according to claim 1, wherein the porous carbon skeleton consists essentially of carbon.

3. A microporous carbon material according to claim 1, wherein the porous carbon skeleton has a porosity of 10% or greater.

4. A microporous carbon material according to claim 1, wherein the porous carbon skeleton has a porosity of 30% or greater.

5. A microporous carbon material according to claim 1, wherein the porous carbon material forms a layer having a thickness in a range from 0.1 to 10 micrometers.

6. A microporous carbon material according to claim 1, wherein the porous carbon skeleton is optically transparent over the visible light spectrum in the absence of an absorbed analyte.

7. A microporous carbon material according to claim 1, wherein the porous carbon skeleton is derived from an amorphous hydrocarbon film, having a gram atom density from about 0.20-0.28 gram atoms/cc.

8. A microporous carbon material according to claim 1, wherein the porous carbon skeleton has a refractive index greater than 2.0.

9. A microporous carbon material according to claim 1, wherein the porous carbon skeleton has a surface area greater than 500 $m^2/g$.

10. An article comprising:
a substrate layer; and
a microporous carbon skeleton layer disposed on the substrate layer, the microporous carbon skeleton having an average pore size from 0.1 to 10 nanometers and being substantially free of pores greater than 10 nanometers; the microporous carbon skeleton layer has an effective coefficient of extinction of less than 0.5; and wherein the refractive index of the microporous carbon material changes in the presence of an adsorbed analyte.

11. An article according to claim 10, wherein the substrate layer is a light transmissive substrate.

12. An article according to claim 10, wherein the substrate layer is a gas permeable layer.

13. An article according to claim 10, wherein the substrate layer is a light reflective substrate.

14. An article according to claim 10, wherein the microporous carbon material forms a layer having a thickness in a range from 0.1 to 10 micrometers.

15. An article according to claim 10, wherein the microporous carbon material forms a filtration layer, a gas separation layer, or a viral separation layer.

16. A method of forming a microporous carbon material comprising;
forming a hydrocarbon plasma from a hydrocarbon gas;
depositing the hydrocarbon plasma on a substrate to form a hydrocarbon layer; and
heating the hydrocarbon layer and removing at least a portion of the hydrogen to form a microporous carbon material; wherein the heating step comprises heating the hydrocarbon layer and removing at least a portion of the hydrogen to form a microporous carbon material having an average pore size from 1 to 10 nanometers and being substantially free of pores greater than 1 micrometer and having an effective coefficient of extinction of less than 0.5, and wherein the refractive index of the microporous carbon material changes in the presence of an adsorbed analyte.

17. A method according to claim 16, wherein the forming step comprises forming a hydrocarbon plasma from a ($C_1$-$C_{10}$) alkane, ($C_1$-$C_{10}$) alkene, or ($C_1$-$C_{10}$) alkyne hydrocarbon gas.

18. A method according to claim 16, wherein the forming step comprises forming a hydrocarbon plasma from a butane or butadiene hydrocarbon gas.

19. A method according to claim 16, wherein the heating step comprises heating the hydrocarbon layer and removing at least a portion of the hydrogen to form a microporous carbon material wherein the microporous carbon material consists essentially of carbon.

20. A method according to claim 16, wherein the depositing step comprises depositing the hydrocarbon plasma on a substrate having a negative bias voltage to form a hydrocarbon layer.

21. A method according to claim 16, wherein the depositing step comprises depositing the hydrocarbon plasma on a substrate having a negative self-bias voltage to form a hydrocarbon layer.

22. A method according to claim 16, wherein the heating step comprises heating the hydrocarbon layer in an ammonia atmosphere and removing at least a portion of the hydrogen to form a microporous carbon material having an average pore size from 1 to 10 nanometers and being substantially free of pores greater than 100 nanometers.

\* \* \* \* \*

UNITED STATES PATENT AND TRADEMARK OFFICE
CERTIFICATE OF CORRECTION

| | | |
|---|---|---|
| PATENT NO. | : 7,901,776 B2 | Page 1 of 1 |
| APPLICATION NO. | : 11/618010 | |
| DATED | : March 8, 2011 | |
| INVENTOR(S) | : Dora M Paolucci | |

It is certified that error appears in the above-identified patent and that said Letters Patent is hereby corrected as shown below:

Title Page, Column 2 (Attorney, Agent, or Firm)
Line 1, delete "Julia" and insert -- Julie --, therefor.

Column 1
Line 17 (approx.), delete "calorimetric" and insert -- colorimetric --, therefor.

Line 20 (approx.), delete "calorimetric" and insert -- colorimetric --, therefor.

Column 6
Line 30, after "thereof" insert -- . --.

Column 13
Line 27, delete "calorimetric" and insert -- colorimetric --, therefor.

Line 28, delete "calorimetric" and insert -- colorimetric --, therefor.

Line 45, delete "IE-5" and insert -- 1E-5 --, therefor.

Column 16
Line 20 (approx.), delete "(3.87×10$^6$)" and insert -- (3.87×10$^{-6}$) --, therefor.

Column 17
Line 14 (approx.), delete "@90" and insert -- @ 90 --, therefor.

Column 22
Line 9 (approx.), in Claim 22, delete "10nanometers" and insert -- 10 nanometers --, therefor.

Signed and Sealed this
Fourteenth Day of June, 2011

David J. Kappos
*Director of the United States Patent and Trademark Office*